(12) United States Patent
Umotoy et al.

(10) Patent No.: US 6,517,592 B2
(45) Date of Patent: Feb. 11, 2003

(54) COLD TRAP ASSEMBLY

(75) Inventors: Salvador P. Umotoy, Antioch, CA (US); Lawrence Chung-Lai Lei, Milpitas, CA (US); Russell C. Ellwanger, San Juan Bautista, CA (US); Ronald L. Rose, Los Gatos, CA (US); Joel Huston, San Jose, CA (US); James Jin-Long Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/740,120

(22) Filed: Dec. 19, 2000

(65) Prior Publication Data

US 2001/0004879 A1 Jun. 28, 2001

Related U.S. Application Data

(62) Division of application No. 09/281,998, filed on Mar. 29, 1999, now Pat. No. 6,206,971.

(51) Int. Cl.⁷ .............................................. B01D 45/08
(52) U.S. Cl. ........................ 55/315.2; 55/325; 55/392.1; 55/434.2; 55/446; 55/DIG. 15
(58) Field of Search ................................ 55/315.1, 315.2, 55/325, 392.1, 434.2, 434.3, 434.4, 445, 446, DIG. 15; 95/288

(56) References Cited

U.S. PATENT DOCUMENTS

| 809,219 | A | * | 1/1906 | Pictet |
| 1,316,330 | A | * | 9/1919 | Modlin |
| 2,386,298 | A | * | 10/1945 | Downing et al. |
| 2,487,115 | A | * | 11/1949 | Dyke |
| 3,963,466 | A | * | 6/1976 | Hynes |
| 4,488,887 | A | * | 12/1984 | Angel et al. |
| 5,271,963 | A | | 12/1993 | Eichman et al. ......... 427/248.1 |
| 5,348,587 | A | | 9/1994 | Eichman et al. ............ 118/723 |
| 5,451,258 | A | | 9/1995 | Hillman et al. ............. 118/715 |
| 5,715,696 | A | * | 2/1998 | Salvagno et al. .......... 55/490.1 |
| 5,820,641 | A | * | 10/1998 | Gu et al. .................... 55/434.4 |
| 5,904,757 | A | * | 5/1999 | Hayashi et al. ................ 55/445 |
| 5,912,368 | A | * | 6/1999 | Satarino et al. ............ 55/385.3 |
| 6,156,107 | A | * | 12/2000 | Hayashi et al. ................ 55/445 |
| 6,206,971 | B1 | * | 3/2001 | Umotoy et al. ............. 118/715 |

* cited by examiner

Primary Examiner—David A. Simmons
Assistant Examiner—Frank M. Lawrence
(74) Attorney, Agent, or Firm—Moser Patterson & Sheridan LLP

(57) ABSTRACT

A temperature-controlled exhaust assembly with cold trap capability. One embodiment of the exhaust assembly comprises a multi-heater design which allows for independent multi-zone closed-loop temperature control. Another embodiment comprises a compact multi-valve uni-body design incorporating a single heater for simplified closed-loop temperature control. The cold trap incorporates a heater for temperature control at the inlet of the trap to minimize undesirable deposits. One embodiment also comprises a multi-stage cold trap and a particle trap. As a removable unit, this cold trap provides additional safety in the handling and disposal of the adsorbed condensables.

12 Claims, 10 Drawing Sheets

COLD TRAP ASSEMBLY

CROSS REFERENCE TO RELATED APPLICATIONS

This application is a divisional of Ser. No. 09/281,998 filed Mar. 29, 1999 now U.S. Pat. No. 6,206,971, entitled "Integrated Temperature Controlled Exhaust and Cold Trap Assembly", issued of Mar. 27, 2001, and contains subject matter that is related to commonly-assigned U.S. Pat. No. 6,364,954, entitled "High Temperature Chemical Vapor Deposition Chamber", issued on Apr. 2, 2002. which is herein incorporated by reference.

BACKGROUND OF THE DISCLOSURE

1. Field of the Invention

The invention relates to a temperature controlled exhaust assembly for a semiconductor wafer processing system and, more particularly, to an integrated exhaust assembly having temperature control with cold trap capability.

2. Description of the Background Art

In the development of wafer processing equipment for device manufacture, the design of an exhaust system may be as important as that for the process chamber. Many, if not most, of the processes used in semiconductor device fabrication involve either corrosive or toxic chemical precursors. Very often, the process reactions lead to similarly toxic by-products, or leave undesirable deposits on interior surfaces of the chamber and/or exhaust assembly. Therefore, the design of an exhaust system should address environmental concerns and safety considerations for operating personnel, as well as the need for ease of maintenance of system components.

Different types of traps are commercially available for use in an exhaust line to trap a variety of chemicals. Examples include molecular sieve traps which work by chemisorption and cold temperature traps for trapping condensable materials. Off-the-shelf cold traps typically involve only a single stage design, and may not have sufficient trapping efficiency to meet certain processing demands. One example of a process that exceeds the capabilities of existing cold traps is the deposition of titanium nitride (TiN) film from a reaction between titanium tetrachloride ($TiCl_4$) and ammonia ($NH_3$). In addition to the reaction products titanium nitride (TiN), nitrogen ($N_2$) and hydrogen chloride (HCl), other by-products such as adduct ammonia salts are formed. It is found that existing single-stage cold traps cannot effectively trap reaction by-products under certain operating and pumping conditions, resulting in the need for additional design remedies.

Another level of complexity also arises because the nature of the material deposit from the $TiCl_4/NH_3$ reaction is temperature dependent Therefore, TiN film deposition is often performed at a temperature of preferably above 600° C. In designing a TiN deposition chamber using a high temperature reaction, it is also desirable to maintain the exterior chamber walls at a lower temperature to ensure the safety of operating personnel. Such a high temperature chemical vapor deposition chamber for TiN film deposition is described in a commonly-assigned U.S. Pat. No. 6,364,954, entitled "High Temperature Chemical Vapor Deposition Chamber", issued on Apr. 2, 2002, and is herein incorporated by reference. This high temperature chamber comprises a heated liner which is thermally isolated from the chamber body such that the chamber exterior remains at a temperature of about 60° C. Since TiN film or reaction by-products are also deposited on the interior surfaces of the chamber, periodic cleaning is needed to maintain reliable process performance. It is known in the art that for the $TiCl_4/NH_3$ based chemistry, a small amount of TiN film is formed at a temperature between 150° C. to 250° C. This film can readily be removed by a chlorine-based chamber cleaning process. Below 150° C., however, an adduct salt powder deposit is formed, but it is resistant to the chlorine-based cleaning process. It is thus highly desirable to maintain the interior walls of the chamber and exhaust assembly at a temperature between 150° C. to 250° C. to facilitate routine chamber cleaning and system maintenance.

Therefore, a need exists in the art for a temperature controlled exhaust system.

SUMMARY OF THE INVENTION

The present invention is a temperature-controlled exhaust assembly with cold trap capability, which can be used in conjunction with a variety of process chambers for different semiconductor wafer processing applications. Specifically, the inventive exhaust assembly contains a conduit for exhaust gases that has at least one attached heater and temperature sensor, and a cold trap connected to the conduit. By maintaining the temperature of the conduit within a range appropriate for the specific process, deposit formation on the interior walls of the conduit can be controlled to reduce the frequency of routine chamber maintenance. A water-cooled cold trap is also provided to adsorb any condensables from the exhaust gases prior to their reaching an exhaust pumping system. The present invention has been used in conjunction with a high temperature chemical vapor deposition chamber for TiN film deposition using a $TiCl_4/NH_3$ chemistry. Since the nature and property of the deposit from this reaction is temperature dependent, it is important to carefully control the chamber temperature in order to achieve optimal process and chamber performance. For example, chamber maintenance is greatly facilitated by maintaining the exhaust assembly within a temperature range of about 150–250° C., because the TiN deposit formed on the interior surfaces of the exhaust assembly can readily be removed by a chlorine-based chamber cleaning process. A cold trap is also provided to adsorb condensables, such as hydrogen chloride (HCl), or other reaction by-products from the exhaust gases.

One embodiment of the invention comprises a multi-heater design, which incorporates a total of six external heaters to heat different portions of the exhaust assembly. Each heater also has an associated temperature sensor to allow for independent closed-loop feedback control by a controller. Furthermore, this embodiment incorporates a single stage multi-loop coil cold trap as an integral component of the exhaust assembly. The cold trap comprises a single baffle plate located close to the entrance of the trap, and a multi-loop cooling coil carrying cooling water at a temperature of about 20–25° C. Condensables from the exhaust gases are adsorbed onto surfaces of the baffle plate and coil. When used in conjunction with the TiN deposition chamber using $TiCl_4/NH_3$ chemistry, the entire exhaust assembly is maintained within the same temperature range of 150–200° C. While this particular application does not take full advantage of the multi-heater design by using a variety of temperatures, it is recognized that this embodiment can potentially provide process control flexibility through independent multi-zone temperature control.

Another embodiment comprises a compact integrated multi-valve uni-body assembly with a single heater that controls the temperature of the assembly. Several valves are mounted onto a single aluminum body which also accommodates a thermoelectric heater and a temperature sensor. For applications requiring temperature control within a single range, this single-heater design greatly simplifies the closed-loop temperature control operation. The unique compact multi-valve uni-body design allows for easy control within a temperature range of about 150–200° C. when used in conjunction with the high temperature TiN deposition chamber.

The valve body also provides vacuum ports for adapting to a removable multi-stage trap assembly, which incorporates a multi-stage cold trap and a particle trap. The cold trap provides multi-stage adsorption through a series of cold baffle plates. The baffle plates contain an arrangement of apertures that are offset from each other. As such, the probability of collisions between gas molecules and the baffle plate surfaces is increased, leading to significant improvement in trapping efficiency for condensables such as HCl, or other reaction by-products.

This embodiment provides added operational flexibility because the multi-stage trap can readily be isolated and removed from the rest of the exhaust assembly. By closing two compact shut-off valves provided respectively at the inlet and outlet of the trap, the adsorbed condensables can be safely contained within the trap and transported to other locations for proper disposal. With its flexible temperature control and compact design, the exhaust and trap assembly can readily be retrofitted and adapted for use with any vacuum chamber for a variety of process applications.

BRIEF DESCRIPTION OF THE DRAWINGS

The teachings of the present invention can be readily understood by considering the following detailed description in conjunction with the accompanying drawings, in which:

FIG. 7b is a cross-sectional view of the assembled shut-off valve shown in FIG. 7a.

To facilitate understanding, identical reference numerals have been used, where possible, to designate identical elements that are common to the figures.

DETAILED DESCRIPTION

Exhaust Assembly with Multi-Zone Heating

Figure 1A:
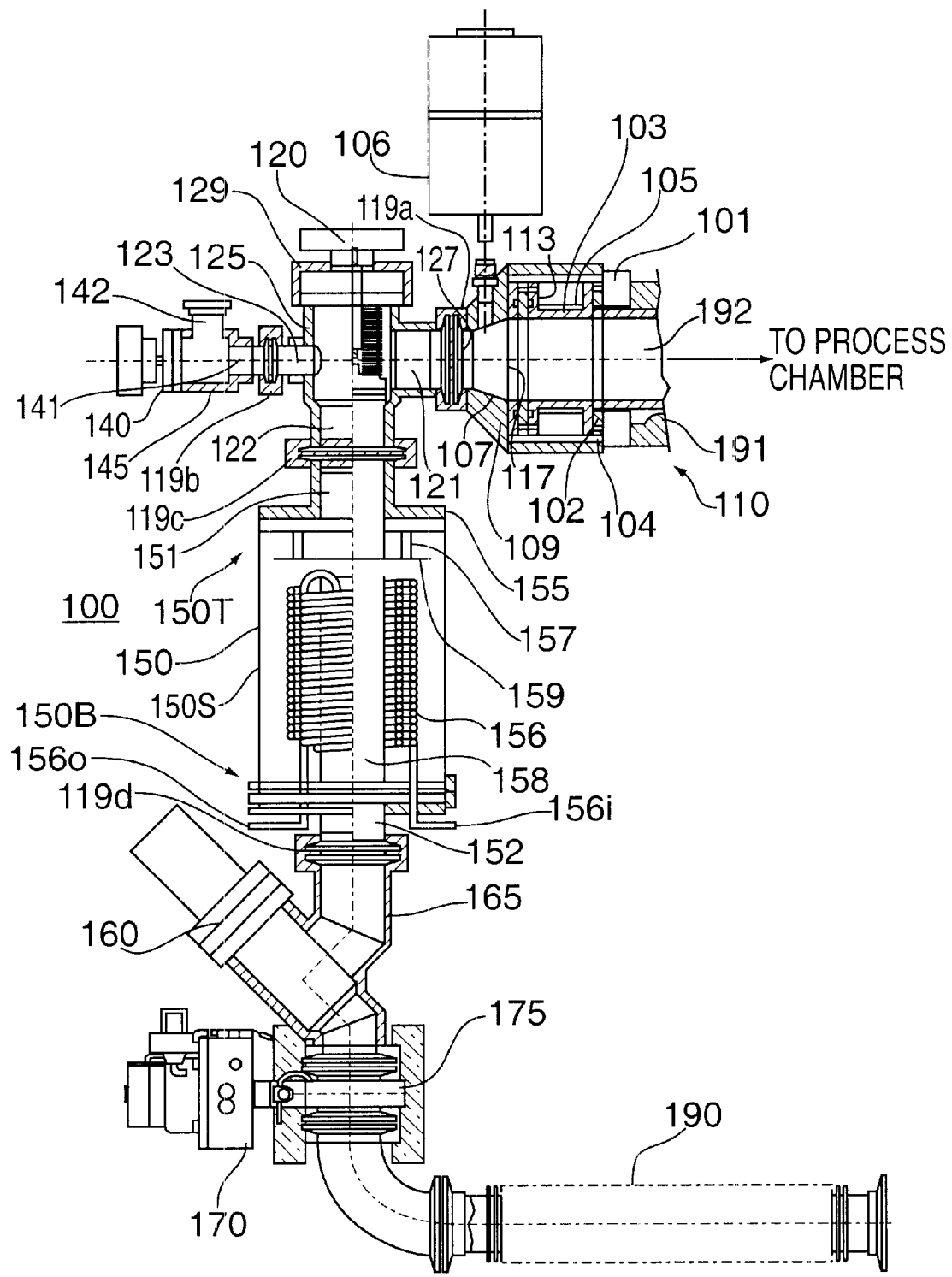
FIG. 1a depicts a cross-sectional view of a first embodiment of a closed-loop temperature controlled exhaust and cold trap assembly.

FIG. 1a depicts a cross-sectional view of one embodiment of a temperature controlled exhaust assembly 100 and its associated vacuum adapting components 110 that are used to connect it to a process chamber (not shown). These vacuum adapting components 110 comprise: an adapter plate 101, a thermal insulator 102, an exhaust tubing (conduit) 103, a band heater 105, a cover plate 104, a 20-torr Baratron 106, and a reducer 107. The annular adapter plate 101 mates directly to a side opening 192 of the process chamber (not shown), and fits around the outside of an exhaust tubing 103 which extends partly into the side opening 192. A thermal insulator 102 is fitted adjacent to the adapter 101 on the side away from the process chamber exterior wall 191. This thermal insulator 102 provides insulation between the heated exhaust assembly 100, which is maintained at a temperature of, for example, about 150° C., and the process chamber exterior wall 191, which is maintained at a temperature of about 60–65° C. A stainless steel band heater 105 circumscribes a substantial portion of the outside wall of the exhaust tubing 103. An annular cover plate 104 fits over the outside of the insulator 102, the band heater 105 and the remaining exhaust tubing 103. In an alternative embodiment, a single flexible heater (not shown) may also be used to heat both the exhaust tubing 103 and the reducer 107. An insulating jacket 109 made of silicone material fits over the annular cover plate 104 and the reducer 107 to prevent possible injury to operating personnel. The reducer 107 connects, at its larger diameter opening 117, to the far end 113 (away from the process chamber) of the exhaust tubing 103, and at its smaller diameter opening 127, to additional components of the exhaust assembly 100. A 20-torr Baratron pressure gauge 106 is connected through the side wall of the reducer 107 to monitor the pressure within the exhaust assembly 100.

In this embodiment, the exhaust assembly 100 also comprises a cold trap 150, in addition to several vacuum valves 120, 140, 160 and 170 for controlling the pumping operation. As such, the various vacuum components (e.g., exhaust tubing 103, reducer 107, cold trap 150, and vacuum valves 120, 160, 170) collectively define a passage way, or conduit, for the exhaust gases within the exhaust assembly 100. Multi-zone temperature control of the exhaust assembly 100 is provided by numerous heaters at various locations of the exhaust assembly 100. These flexible heaters are made of silicone materials, and are wrapped around the exterior walls of the exhaust assembly 100 underneath their respective insulating fabric jackets—these heater/jacket combinations are designated as 125, 145, 155, 165, 175 in FIG. 1a. Thermocouple temperature sensors (not shown in FIG. 1a) are also provided with these heaters, and may be used for closed-loop feedback control of the heater temperature via a control console 199 (see FIG. 1b) comprising a controller 193.

Figure 1B:
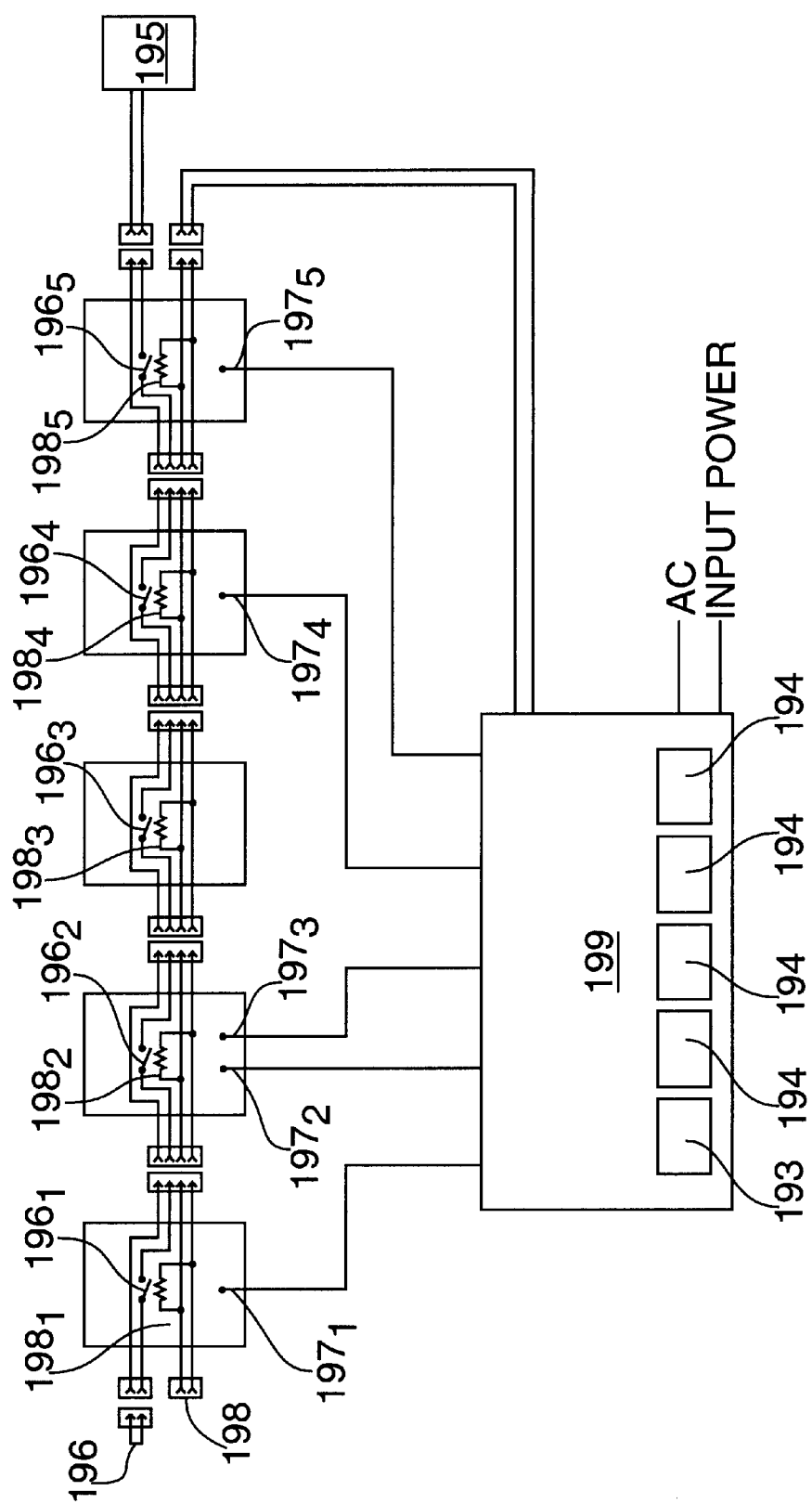
FIG. 1b depicts a schematic diagram for closed-loop temperature control.

FIG. 1b depicts schematically the control console 199 connected to a series of temperature sensors $197_1$, $197_2, \ldots, 197_5$ (collectively sensors $197_i$) and the associated heaters $198_1, 198_2, \ldots, 198_5$ (collectively heater $198_i$). In this particular embodiment, each heater $198_i$ is also connected to a power supply 195 via a thermostatic switch $196_i$. The heaters $198_i$ and temperature sensors $197_i$, for example, are disposed around the various valves and vacuum components of the exhaust assembly 100 as discussed below. As shown in FIG. 1b, all the heaters $198_i$ are maintained at the same temperature setting by connecting them in series to the control console 199. The control console 199 comprises, for example, a Watlow 965 PID controller 193 and several adjustable temperature interlocks 194. For the current TiN chamber application, a single point temperature control for the entire exhaust assembly 100 is found to be adequate. For example, effective closed-loop temperature control is achieved by monitoring the temperature sensor $197_2$ located around the manual valve 120. As a safety precaution, other sensors $197_1$, $197_3$, $197_4$ and $197_5$ are provided with heaters $198_1$, $198_2$, $198_4$ and $198_5$ (corresponding to heaters 105, 125, 155 and 165 in FIG. 1a) and are used in conjunction with the temperature interlocks 194 for "over temperature" control. The design flexibility in the present invention is further illustrated in the embodiment shown in FIG. 1b, where over-temperature protection for the heaters $198_2$ (corresponding to heater 125 for the valve 120) and $198_3$ (corresponding to heater 145 for the valve 140) are effectively provided by a single sensor $197_3$. Such "shared" protection is possible due to the proximity of the heaters 125 and 145 to one another. By modifying connections to the control console 199, the heaters 198 can also be individually connected to additional power supplies 195 (not shown) to allow for independent temperature control at different temperature settings. The heaters, temperature sensors and control console 199 are customized for the current application and are available as Nor-Cal part number NC-000001-2.

When used in conjunction with the high temperature TiN deposition chamber using $TiCl_4/NH_3$ chemistry, the exhaust assembly 100, with the exception of the cold trap 150, is maintained at a temperature of approximately 150–200° C. so as to reduce undesirable deposits from coating the interior of the exhaust assembly 100. This embodiment is especially well suited to other applications which may require separate temperature control for different parts of the exhaust assembly 100. For example, a heater 125 (such as $198_2$ in FIG. 1b) is used to heat an angle valve 120, which serves as an inlet valve for the exhaust assembly 100. The angle valve 120 is provided with three vacuum ports, 121, 122 and 123. The valve 120 is connected to a process chamber (not shown) via the reducer 107 at the inlet port 121, and is connected at the outlet port 122 to a cold trap 150, which is provided with its own heater 155, e.g., $198_4$ of FIG. 1b. With suitable modifications, the angle valve 120 and the cold trap 150 can be independently temperature-controlled, if desired.

The vacuum port 123 at the side of the angle valve 120 is connected to the port 141 of a manual valve 140. The manual valve 140, which is fitted with a separate heater 145, such as $198_3$ of FIG. 1b, may be used to connect, via a port 142, to other vacuum accessories or process diagnostic equipment such as a leak detector or a residual gas analyzer (RGA).

The cold trap 150 is connected at its inlet 151 to the valve 120, and at its outlet 152 to an isolation valve 160. The cold trap 150 houses a baffle plate 159 and a multi-loop cooling coil 156. Both the housing 150 and the baffle plate 159 are made of stainless steel with nickel plating, although other materials are also acceptable provided that they are chemically compatible with the process gases used. The baffle plate 159 is mounted close to the inlet 151 of the cold trap 150, and is suspended from the top 150T of the cold trap 150 by stainless steel spacers 157, which are either screwed in or brazed to the baffle plate 159. The cooling coil 156, which is suspended inside the cold trap 150, is brazed to the bottom 150B of the cold trap 150. The cooling coil 156 has an inlet 156i and an outlet 156o. A circulating heat transfer fluid, such as cooling water, enters the cold trap 150 via the inlet 156i and leaves via the outlet 156o. The multi-loop coil 156 provides a large cold surface area for trapping condensables from the exhaust gases. For example, an inlet water temperature of about 20–25° C. may be used for trapping condensables generated from a $TiCl_4/NH_3$ based TiN deposition process. Of course, other cooling media can also be used as appropriate, especially if lower temperature application is desired. Although the present embodiment uses a multi-loop coil, other designs such as cooled metal strips or fin-like structure may also be used. The key point is that a larger cooled surface area is preferable in order to increase the trapping efficiency of the cold trap.

As shown in FIG. 1a, an external heater 155 (e.g., $198_4$ in FIG. 1b) is also used for temperature control around the cold trap 150. For example, when used in conjunction with the high temperature TiN deposition chamber, the external heater 155 provides heating around the inlet 151 of the trap 150. With the heater 155 adjusted for a temperature of about 150° C., and a cooling coil temperature of about 20–25° C., the temperature of the baffle plate 159 can be maintained within a range of 40–70° C. This design of the heater 155 and cooling coil 156 locations leads to a temperature gradient being established along the cylindrical side 150S of the cold trap 150. For example, the top 150T of the trap 150 has a temperature of about 70° C., which decreases to about 45° C. at some intermediate distance, while the bottom 150B of the trap 150 has a temperature of about 30° C. The heater 155 serves to minimize deposits around the inlet 151 and the baffle plate 159. Due to the lower temperature at the bottom 150B of the trap 150, condensables tend to deposit there first. Therefore, this particular design helps minimize excessive deposit build-up towards the inlet 151 of the trap 150, which would otherwise lead to deterioration of trapping performance.

When exhaust gases enter the cold trap 150 through the inlet 151, which is located along a center axis of the cold trap 150, they are diverted by the baffle plate 159 to flow radially outwards towards the cylindrical side 150S of the cold trap 150. Some condensables are trapped onto the baffle plate 159, while most are trapped onto the cold surface of the multi-loop cooling coil 156. The remaining exhaust gases are pumped through an axially located tube-like channel 158 prior to exiting the cold trap 150 via the outlet 152.

An isolation valve 160 connects between the outlet 152 of the cold trap 150 and a throttle valve 170. This isolation valve 160 can be used to isolate the exhaust and cold trap assembly 100 from the pumping foreline 190. The isolation valve 160 is also used, in conjunction with the throttle valve 170, to allow for proper sequencing and pressure control during the process and pump-down cycle. Furthermore, both the isolation valve 160 and the throttle valve 170 are equipped with external heaters 165 and 175. The heater 165, for example, corresponds to $198_5$ shown in FIG. 1b. The heater 175 used in this embodiment is provided with a built-in thermostat control, and is not connected to the control console 199. Since the cold trap 150 is not 100% effective in trapping all condensables from the exhaust gases, heaters 165 and 175 are needed in order to prevent the formation of undesirable powder deposits inside the valves 160 and 170. Heater jackets 129, 119a, 119b, 119c, and 119d are also provided around the angle valve 120 and various clamp areas of the exhaust assembly 100 both to minimize heat loss and to provide a safe operating environment.

Although a chlorine-based chamber cleaning process provides efficient dry cleaning of the interior of the exhaust assembly 100 after each wafer deposition, powder deposits tend to accumulate after an extended period of wafer processing—e.g., 5000 wafers. These deposits can readily be removed by cleaning with water or hydrogen peroxide during periodic maintenance. The use of the heated exhaust assembly 100 contributes to equipment uptime by reducing the time required for cleaning and extending the time interval between chamber cleans.

Integrated Exhaust Assembly

Figure 2:
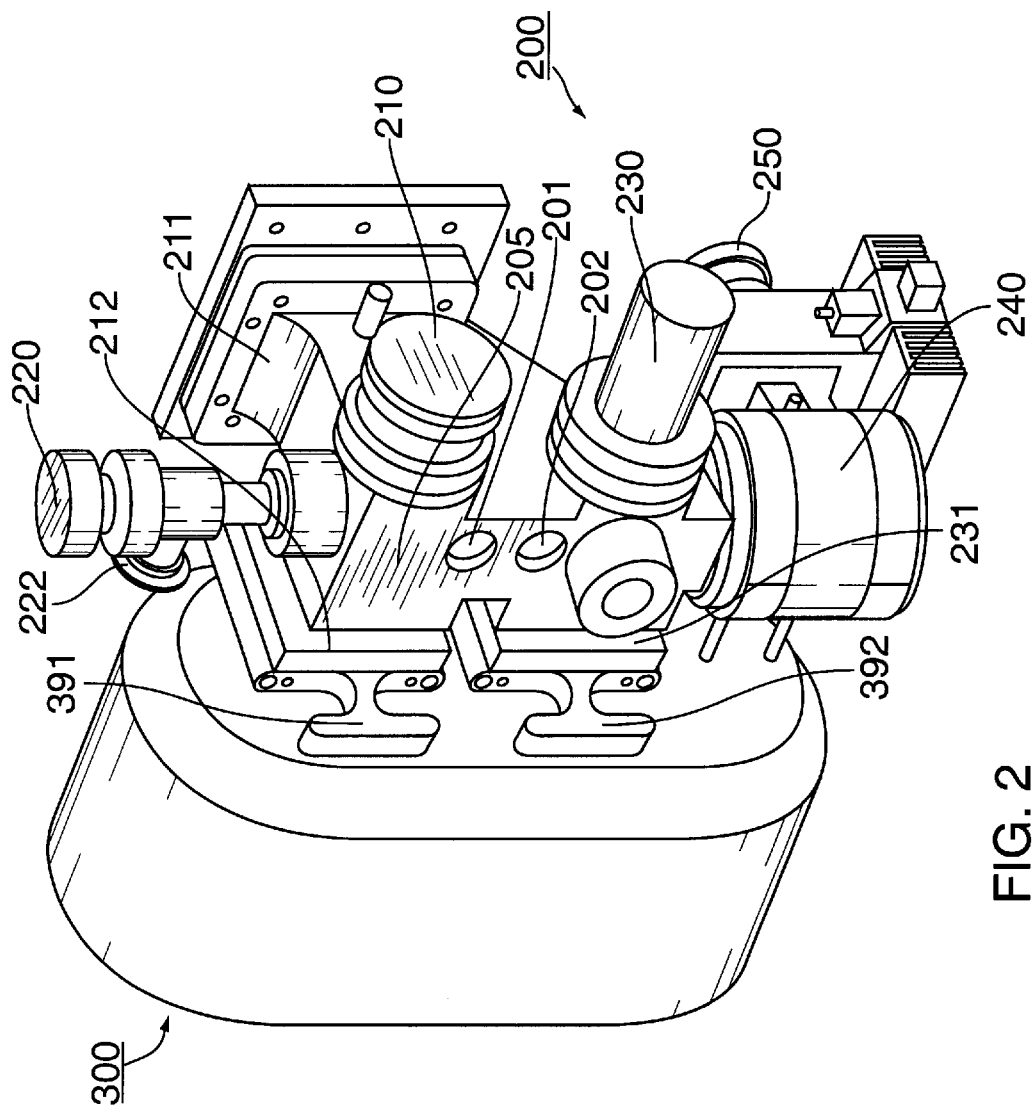
FIG. 2 depicts a perspective view of a second embodiment of the present invention, comprising an integrated temperature controlled exhaust and a multi-stage cold trap.

Another embodiment of the present invention comprises an integrated uni-body exhaust assembly 200 shown in a perspective view in FIG. 2. In this embodiment, a single valve body 205 houses several valves 210, 220, 230, 240 and vacuum ports 212, 231 for adapting to a removable cold trap 300. The valve body 205 is fitted with a single cartridge heater (not shown) within recess 201 and a thermocouple sensor (not shown) within recess 202 for temperature monitor and control. This embodiment encompasses a unique compact design, whose size is reduced to almost ⅓ of that of the multi-heater design illustrated in FIG. 1a. With only one heater and one temperature sensor, this new design offers a simplified electrical control and temperature management system for applications requiring only a single temperature control. Additional process flexibility and safety is achieved through the removable multi-stage trap 300, which can be isolated from the valve body 205 by closing valves 391 and 392 prior to removal of the trap 300 from the assembly 200.

Four valves 210, 220, 230, 240 are mounted on a valve body 205 made from a solid block of aluminum having ports and bores for the valves milled into the block. These valves include: 1) a manually-operated valve 210 for isolating the process chamber (not shown) from the exhaust assembly 200; 2) an angle valve 220 for coupling to other wafer processing system accessories (not shown), 3) a pneumatic valve 230 for isolating the exhaust assembly 200 from the exhaust pump line (not shown), and 4) a throttle valve 240 located between the pneumatic valve 230 and the exhaust pumping system (not shown) that connects to a vacuum tubing (conduit) 250. To ensure proper pressure control and sequencing of valve operation during the process and pump-down cycle, the operation of the isolation valve 230 is synchronized with the throttle valve 240, although such synchronized operation is not absolutely necessary to achieve proper operation of the exhaust assembly 200. Similar to the embodiment described previously, the various components such as valves 210, 220, 230, 240, valve body 205, and tubing 250, collectively define a passageway, or conduit, for exhaust gases within the exhaust assembly 200.

The right-angled valve 220 provided at the top of the valve mounting body 205 allows other accessories to be connected to the flow path of the exhaust gases for leak testing, or other process diagnostics purpose. For example, a leak detector unit or a residual gas analyzer (not shown) can be connected to the side port 222 of the right-angled valve 220 for vacuum leak detection or for analyzing the exhaust gas composition. The chamber close-off valve 210 has an inlet port 211 which is connected to a process chamber (not shown) and an outlet port 212 which is connected to a multi-stage trap 300 via a shut-off valve 91.

Two recessed openings 201, 202 are provided in the valve mounting body 205 to accommodate a cartridge heater (not shown) and a thermocouple temperature sensor (not shown). A thermally conductive paste is used to line the inside of the opening to ensure good thermal contact between the heater (not shown) and the valve body 205. Likewise, a thermocouple is inserted into the second opening 202, adjacent to the heater. Both the heater and the thermocouple control are connected as part of a feedback circuit, similar to FIG. 1b, to a control unit for overall control of the operation of the process chamber and the exhaust assembly 200. The unitary valve body design allows the use of a single heater and thermocouple, which greatly simplifies the closed-loop temperature control procedure for the exhaust assembly 200. By substituting different heaters and thermocouple sensors in the unitary valve body 205, temperature control can be accomplished over a wide range of temperatures for different process applications. For example, in the case of TiN film deposition using $TiCl_4/NH_3$ reaction, the exhaust assembly 200 is maintained at a temperature of about 150° C. The TiN film deposited on the interior surfaces of the exhaust assembly 200 is readily removed by a thermal chlorine-based cleaning process. However, after extended wafer processing, a white powder deposit tends to accumulate inside the exhaust assembly 200. This powder deposit can easily be cleaned with either water or hydrogen peroxide during periodic maintenance.

Multi-Stage Cold Trap

Figure 3A:
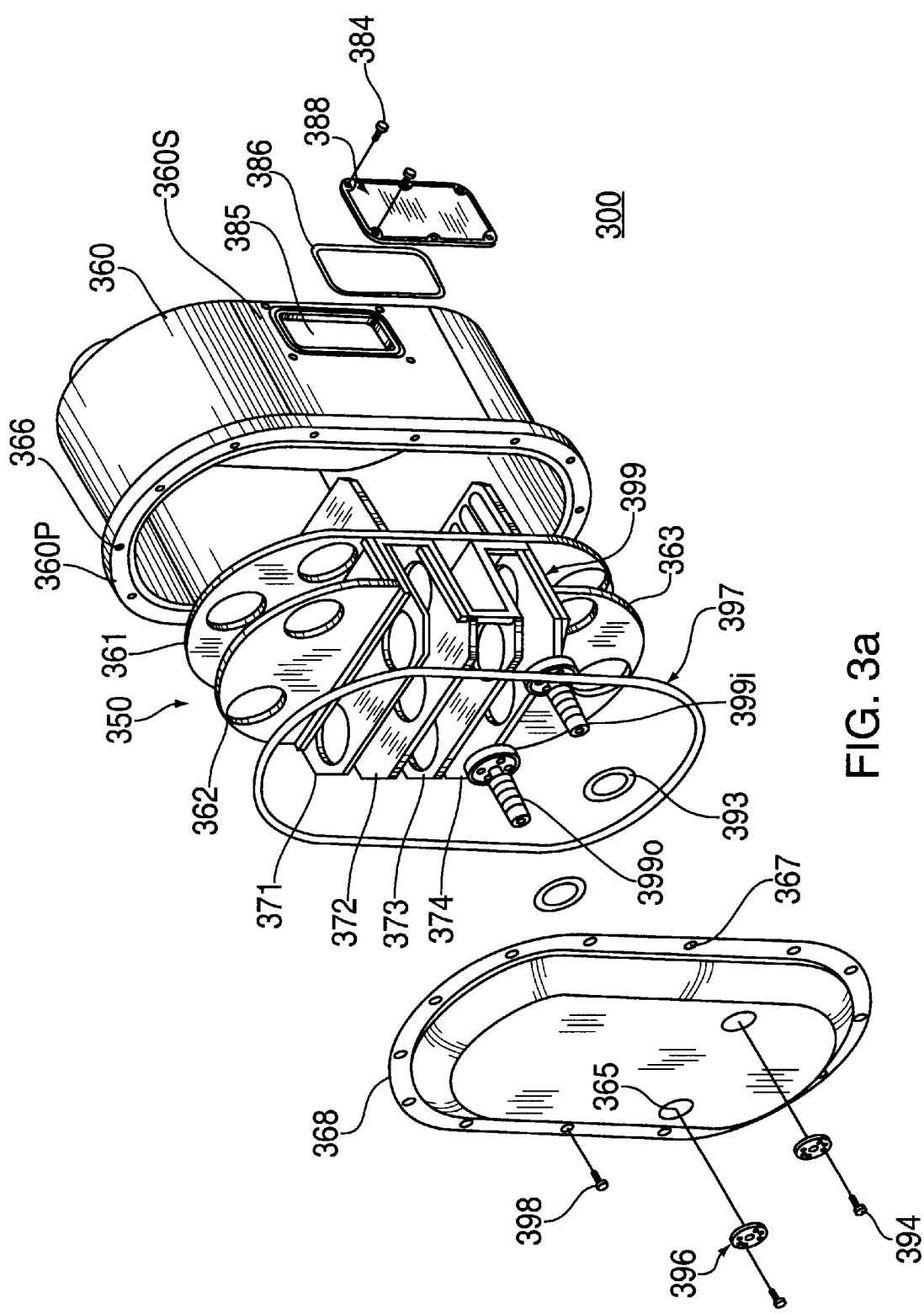
FIG. 3a is an exploded perspective view of the multi-stage cold trap shown in FIG. 2.
Figure 3B:
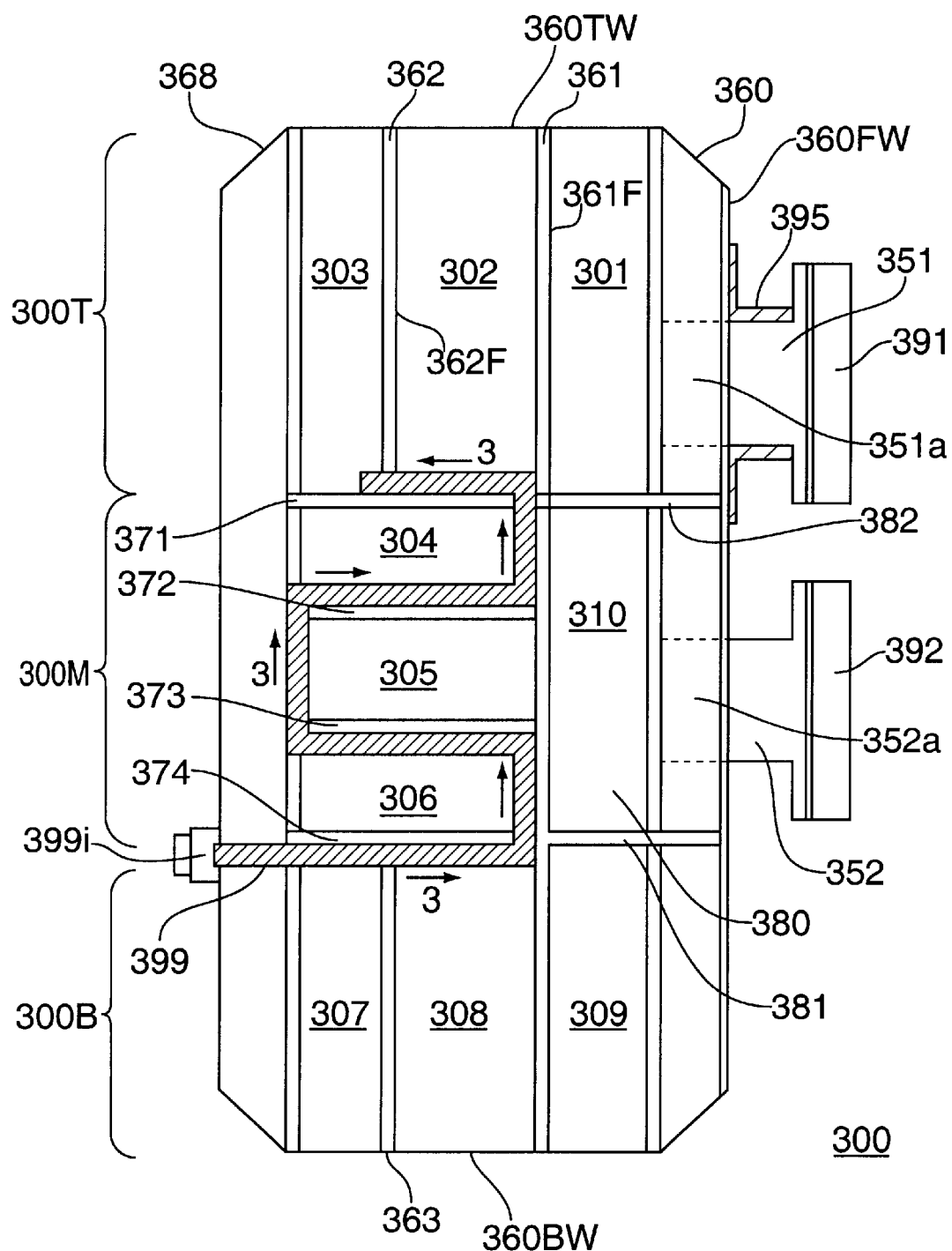
FIG. 3b is a side view of the multi-stage cold trap shown in FIG. 2.

FIG. 3a and FIG. 3b respectively show an exploded perspective view and a side view of the multi-stage cold trap 300 which comprises a multi-stage baffle structure 350 enclosed within a cold trap housing 360 and a cold trap cover 368. An increase in the trapping efficiency of condensable by-products is achieved by increasing the collisions between gas molecules and the various baffle plates which make up the multi-stage baffle structure 350. As illustrated in FIG. 3a, the multi-stage baffle structure 350 is cooled by circulating a heat transfer medium inside a cooling coil 399, which is welded onto the baffle structure 350. The baffle structure 350 is attached to the cold trap cover 368 by two mounting plates 396 using a plurality of screws 394. The cooling coil inlet 399i and outlet 399o protrude through two openings 365 on the trap cover 368, with two viton O-rings 393 providing vacuum sealing against the trap cover 368 from the inside. The multi-stage baffle structure 350 is secured inside the cold trap 300 by mounting the cold trap cover 368 onto the housing 360 with a plurality of screws 398. Fourteen clearance holes 367 on the cold trap cover 368 and corresponding threaded holes 366 around the perimeter 360P of the housing 360 are provided for this purpose. A viton O-ring 397 provides vacuum sealing between the cold trap housing 360 and the cold trap cover 368. As such, the cold trap 300 can be easily dismantled to facilitate cleaning during periodic maintenance.

FIG. 3b shows a side view of the various compartments, or chambers, 301 through 310 inside the cold trap 300. These compartments 301–310 are typically defined by four surfaces, which may either be interior walls (e.g., 360TW, 360FW) of the housing 360 or baffle plates such as 361 or 362. The cold trap 300 can be visualized as divided into three portions—top 300T, middle 300M, and bottom 300B. Exhaust gases from the process chamber enter the top portion 300T of the cold trap 300 via the inlet port 351. The top ortion 300T comprises three compartments 301, 302 and 303 separated by two vertical baffle plates 361 and 362. The first compartment 301 can be considered an "entrance" compartment. It is defined by a front wall 360FW of the trap housing 360, a top wall 360TW of the trap housing 360, a vertical baffle plate 361 and a horizontal baffle plate 382. At this top portion 300T of the cold trap 300, the front wall 360FW of the housing 360 has an opening 351a (shown in phantom in FIG. 3b) at the inlet port 351 and serves as an entrance to the cold trap 300. An external heater 395 is disposed around the exterior of the inlet port 351 of the cold trap 300 to maintain a temperature of about 150° C. This helps minimize undesirable deposits from forming within the inlet 351.

Figure 4A:
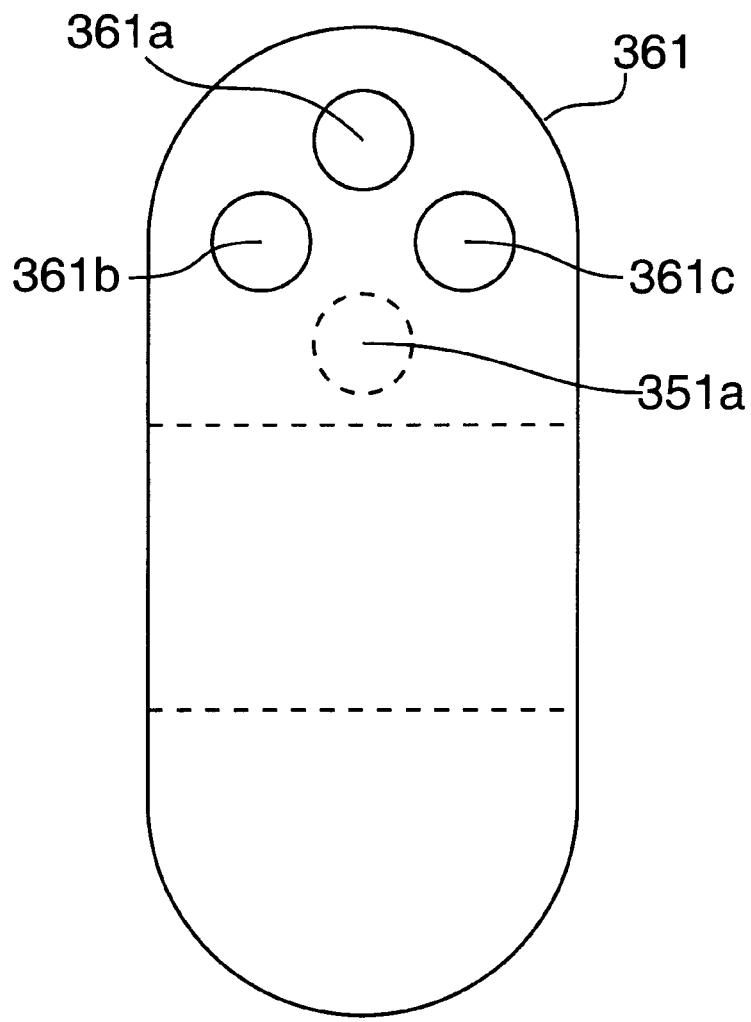
FIG. 4a is a front view of the first vertical baffle plate shown in FIG. 3b.

The first vertical baffle plate 361 extends from the top wall 360TW to the bottom wall 360BW of the housing 360, while the second baffle plate 362 extends from the top wall 360TW to an intermediate distance about ⅓ along the length of the housing 360. The first vertical plate 361 has three holes or apertures 361a, 361b, 361c arranged as shown in FIG. 4a, which illustrates the view from the "front" of the cold trap 300. The inlet opening 351a corresponding to the entrance of the trap 300 is shown in phantom to indicate its relative position with respect to the three apertures 361a, 361b, 361c in the first vertical baffle plate 361. In this offset design, the apertures from each apertured surfaces are located such that when the area of any aperture is projected along a direction perpendicular to the surface containing that aperture, the "area of perpendicular projection" should preferably not overlap or intersect any apertures on another apertured surface defining the same compartment. That is, the projected area corresponding to the inlet opening 351a of the housing 360 should preferably not overlap any of the apertures 361a, 361b, 361c on the first vertical baffle plate 361. Such an "offset" design increases the probability that gas molecules exiting from the chamber valve 210 and entering the cold trap 300 strike the first vertical baffle plate 361 prior to being pumped through the openings or apertures 361a, 361b, 361c of the first vertical baffle plate 361. Collisions of gas molecules with the cold baffle plate 361 cause molecules to lose kinetic energy, and allows trapping of the molecules onto the front surface 361F of the baffle plate 361. Of course, some degree of overlap between different apertures is not precluded from the present invention.

Figure 4B:
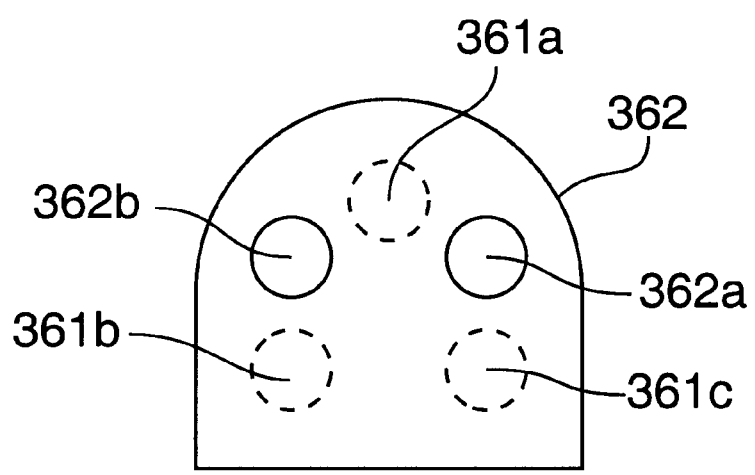
FIG. 4b is a front view of the second vertical baffle plate shown in FIG. 3b.

FIG. 4b shows the second vertical baffle plate 362 with two apertures 362a, 362b arranged to be individually offset from the three apertures 361a, 361b, 361c of the first vertical baffle plate 361. The "areas of perpendicular projection" of the three apertures 361a, 361b, 361c of the first vertical plate 361 are shown in phantom. The baffle plate apertures used in the present invention are approximately 2 in. (50.8 mm) in diameter. Dimensions cited in this embodiment are for illustrative purposes only, and other variations can also be used without detracting from the spirit of the present invention. For optimal trapping efficiency, the offset design should be used to position each of the openings or apertures within the trap 300.

Returning to FIG. 3b, the middle portion 300M of the cold trap 300 comprises three compartments 304, 305 and 306 respectively defined by the back wall 360BW of the housing 360, the first vertical plate 361 and different combinations of two of the four horizontal plates 371, 372, 373 and 374.

Figure 5A:
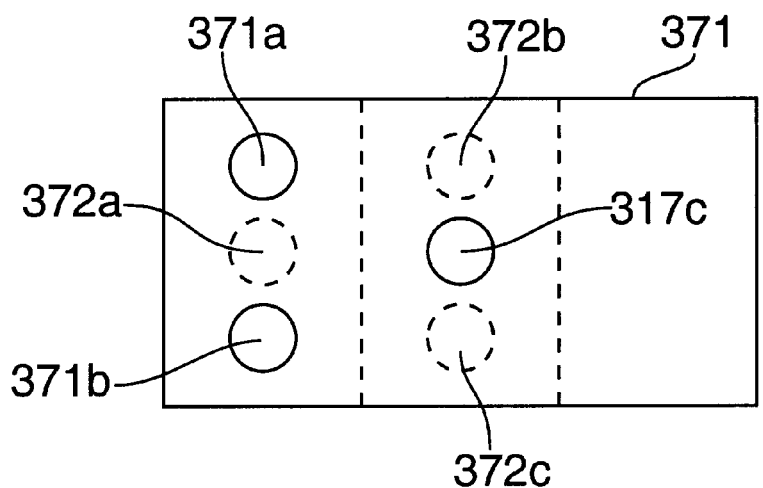
FIG. 5a is a top view of the first horizontal baffle plate shown in FIG. 3b.
Figure 5B:
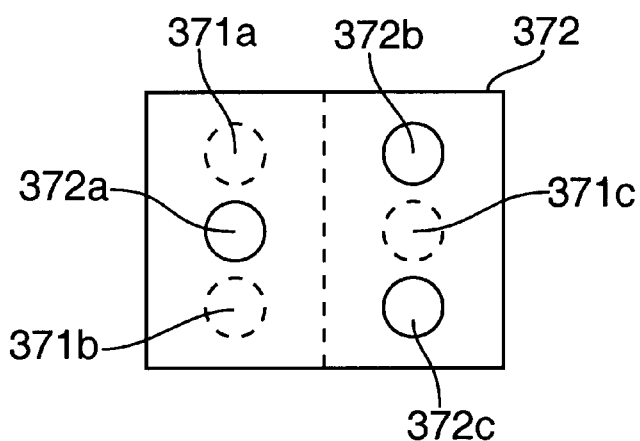
FIG. 5b is a top view of the second horizontal baffle plate shown in FIG. 3b.

The first (top) and the last (bottom) horizontal plates 371, 374 are identical in design, and extend across the entire width of the trap assembly housing 360. The second and third plates 372, 373 extend only partially across the housing 360—from the back 360BW to about ⅔ of the width, where it is brazed to the first vertical baffle plate 361. Although these plates can be screw-mounted to each other, brazing is preferred because it ensures efficient thermal conduction among the components of the cold trap 300. Similar to the vertical baffle plates 361, 362 the horizontal plates 371–374 are also provided with apertures which are arranged to be offset from those in successive, or adjacent plates. A top view of the first horizontal baffle plate 371 is shown in FIG. 5a, with the aperture 372a for the second horizontal baffle plate 372 shown in phantom.

Another compartment 310 is defined by the horizontal plates 381, 382, the first vertical baffle plate 361, and the front wall 360FW of the housing 360. This compartment 310 can be thought of as an "exit" compartment because it is connected to the exhaust assembly 100 via an opening 352a in the housing wall 360FW through an outlet 352 and a shut-off valve 392. Exhaust gases that enter the multi-stage cold trap 300 via the inlet valve 391 travel through the various compartments 301–310 before exiting the cold trap 300 via the outlet 352.

As shown in FIGS. 3a and 3b, a cooling coil 399 is welded or brazed in a meander pattern to the vertical and horizontal baffle plates 361, 362, 371, 372, 373, 374 starting from one side of the housing 360 across to the other side, where a similar meander pattern is provided along the baffle plates 361, 362, 371, 372, 373 and 374. This allows a heat transfer medium, such as cooling water, to travel from a coolant inlet 399i adjacent to the bottom plate 374 to the top horizontal baffle plate 371, along the direction shown by the arrows 3 in FIG. 3b. The heat transfer medium then continues across to the other side (not shown) of the housing 360, and exits from an outlet opening (not shown). In this embodiment, the cooling coil 399 is made of nickel-plated aluminum because of the need for compatibility with chlorine, which is used in a chamber clean process. Of course, other suitable materials may also be used, as long as they satisfy the requirements of good thermal conductivity and chemical compatibility with the exhaust and cleaning process gases. With an inlet water temperature around 20–25° C., the temperature of the baffle plates can be maintained between 20–25° C., while that of the trap body is between 45–70° C.

The bottom portion 300B of the cold trap 300 comprises three compartments 307, 308, 309 which are separated by two vertical baffle plates 363, 361. These vertical baffle plates 363, 361 are designed and arranged in similar fashions as previously described for the plates 362, 361 in the top portion 300T. That is, exhaust gas molecules undergo successive collisions with adjacent baffle plates as they travel from one compartment to the next. With this multi-stage design, the cold trap 300 offers a trapping efficiency approaching 95% for 2 μm size particles.

All the baffle plates 361–363, 371–374, and the housing 360 in the present invention are made of nickel-plated aluminum in order to ensure chemical compatibility with chlorine, which is used in a chamber cleaning process. Of course, depending on the specific process applications, other materials such as stainless steel can also be used as long as they have the requisite chemical compatibility and thermal properties suitable for cold trap applications. Therefore, materials used in this embodiment are meant to be illustrative only, and do not represent inherent limitations in the present invention.

Figure 6:
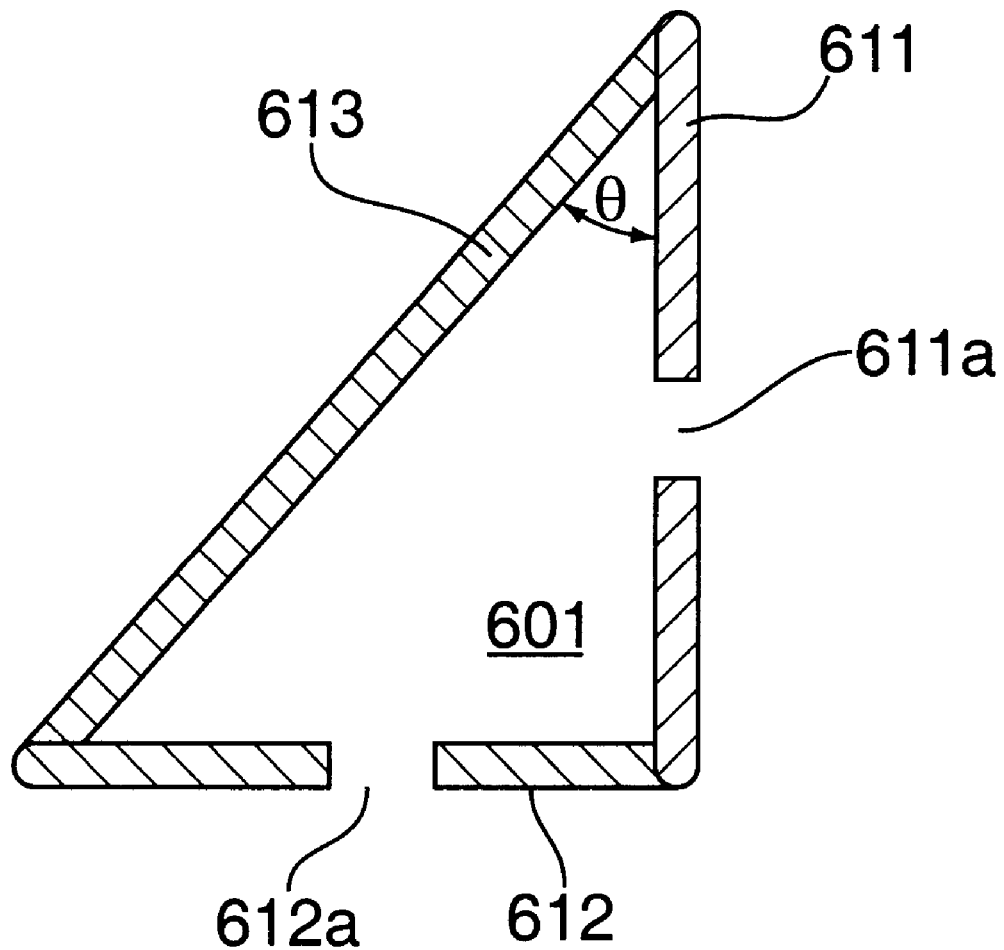
FIG. 6 is a cross-sectional view of an alternative arrangement of baffle plates inside a multi-stage trap.

Although the baffle plates 361–363, 371–374 of the present invention are arranged in vertical and horizontal directions, they are by no means the only possible arrangements. In fact, each of the compartments 301–310 within the trap 300 may be defined by different combinations of baffle plates or interior walls of the housing 360. For example, a compartment 601 may be formed by only three surfaces as illustrated in a cross-sectional view of FIG. 6. Two of these surfaces may be baffle plates 611, 612 each having at least one aperture 611a, 612a and the third surface 613 may be disposed at an angle θ with respect to the baffle plate 611. Gas molecules entering this compartment 601 through the aperture 611a of the baffle plate 611 collide with the third surface 613. Some molecules will be adsorbed onto the surface 613 while others will scatter off and further collide with baffle plates 611 or 612. The location of the aperture 612a should preferably be selected such that molecules can exit via the aperture 612a only after multiple collisions with surfaces 611, 612 and 613. Therefore, the present invention encompasses design variations which seek to minimize the probability of molecules passing through a trapping structure via a direct, non-collisional path; as well as those which seek to maximize the collisions between exhaust gas molecules and cold surfaces.

Figure 5C:
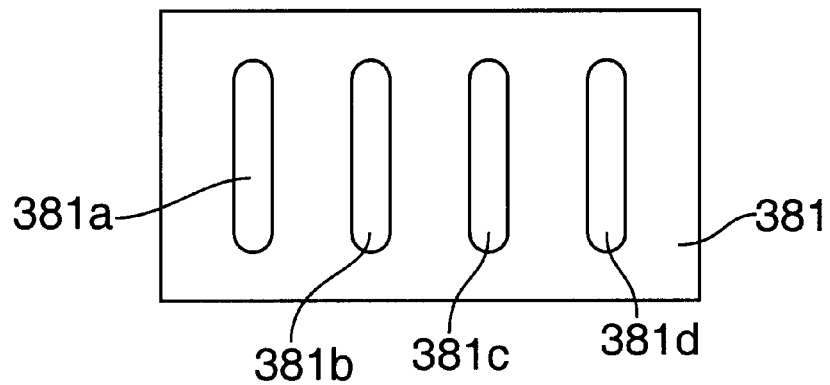
FIG. 5c is a top view of the bottom filter plate of the shown in FIG. 3b.

Referring back to FIG. 3b, exhaust gases, after exiting the compartment 309 of the cold trap 300, enter a particle filter 380, which comprises a bottom filter plate 381 with several slots 381a, 381b, 381c, 381d (see FIG. 5c for a top view of plate 381) and a solid top filter plate 382. Particles in the exhaust gases are trapped by a filtering material, such as a fine stainless steel gauze pad, placed between the bottom and the top filter plates 381 and 382, which is effective for trapping particles with diameters above 2 $\mu$m. This filter material is replaced during routine maintenance. In general, different types of filtering materials can be selected to trap particles of various sizes. Access to the particle filter 380 is provided by an access port 385 on the side 360S of the cold trap housing 360. (See FIG. 3a.) A filter cover 388 is mounted over the access port 385 with a plurality of screws 384, and a viton O-ring 386 is used to provide sealing between the filter cover 388 and the cold trap housing 360.

Shut-off Valves

Two custom-designed shut-off valves 391, 392 are provided at the inlet 351 and outlet 352 of the trap 300 for sealing the trap 300 from the exhaust assembly 200. This facilitates the periodic cleaning procedure by allowing the cold trap 300 to be removed and transported with the trapped by-products safely contained therein. In the case of the TiN film deposition process, one of the reaction products is hydrogen chloride (HCl), which turns into hydrochloric acid upon exposure to moisture in the air. Therefore, the shut-off valves 391, 392 allow a safe handling of the cold trap 300 during maintenance. Alternatively, for process applications which do not require cold trap capability, the cold trap 300 can readily be isolated from the exhaust assembly 200 by closing the valves 391, 392.

Figure 7A:
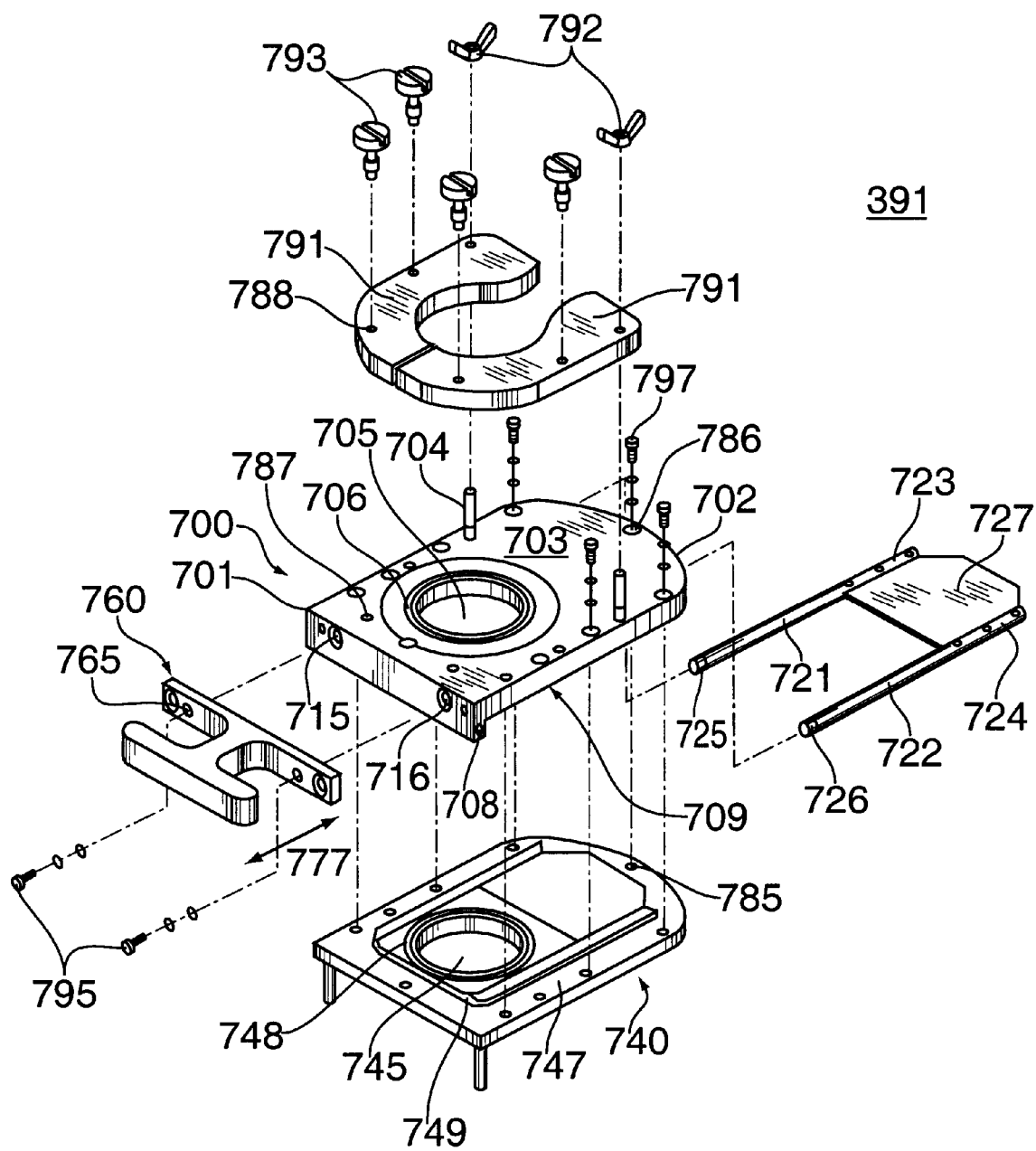
FIG. 7a is an exploded view of the shut-off valve for use with the multi-stage cold trap of FIG. 3b.
Figure 7B:
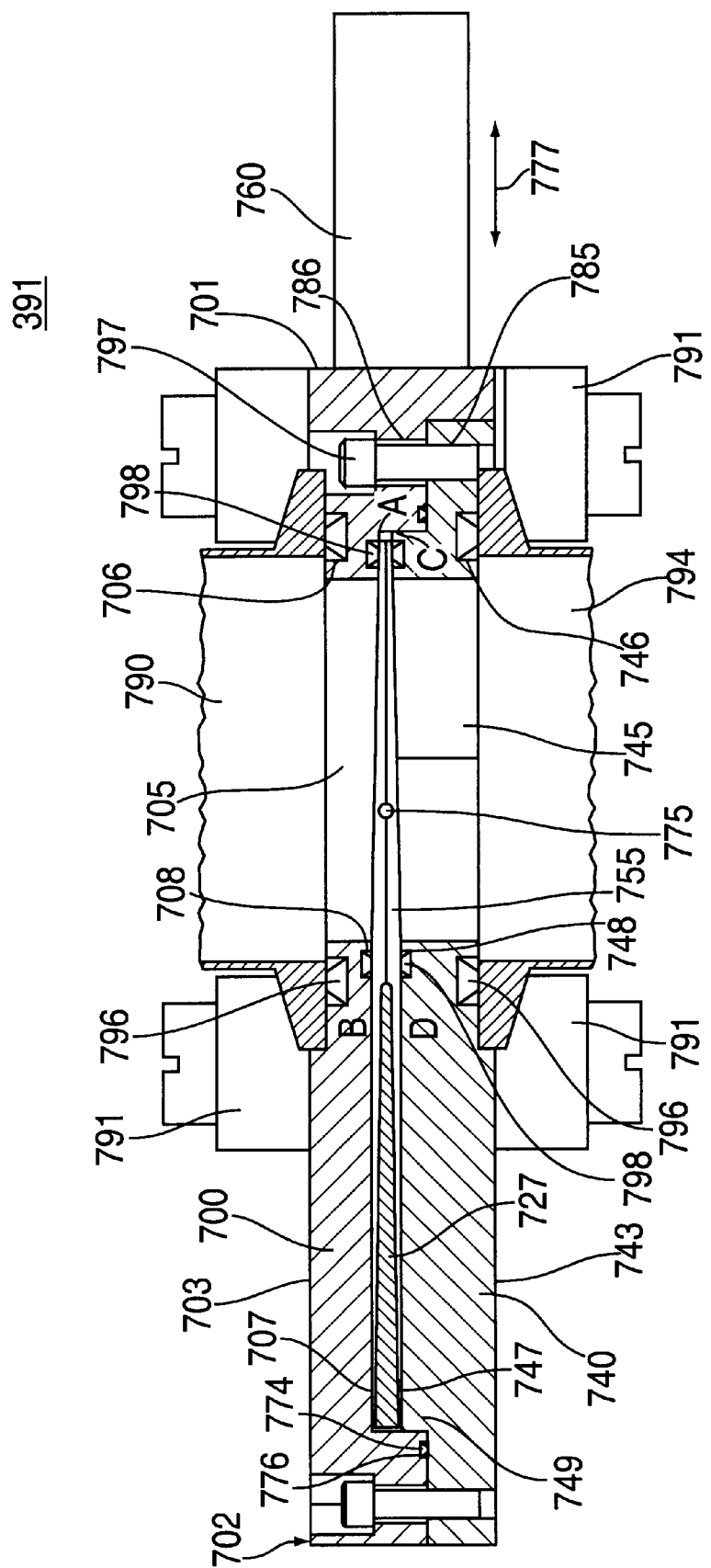

The shut-off valve 391 has a very compact design, with a thickness of only about 0.75 in. (19.1 mm). As such, it offers design flexibility and can readily be retrofitted to any existing chamber. While the current model is manually operated, it can easily be adapted for electronic control by adding a motorized or solenoid actuator to facilitate movement of the valve. FIG. 7a shows an exploded view of the shut-off valve 391 (valve 392 is identical), which adopts a gate valve design, and FIG. 7b is a cross-sectional view of the assembled valve 391 in its open position.

The valve 391 comprises a top plate 700, a gate 727, a bottom plate 740, and a handle 760. The gate 727, which is attached to the handle 760 via two parallel shafts 721, 722, is a wedge-shaped plate that fits between the top plate 700 and the bottom plate 740. The valve 391 can be open and closed by sliding the handle 760, and thus the gate 727, along the direction indicated by the arrow 777.

As shown in FIG. 7a, the top plate 700 is substantially rectangular in shape and has an arcuate end 702 on one side and a rectangular end 701 on the other. An opening 705, which serves as an inlet of the valve 391, is disposed slightly off-center away from the rounded end 702. A small protruded portion 708 is provided around the perimeter of the top plate 700, while a recessed portion 709 is found on the inside surface 707 of the top plate 700. Around the opening 705, the inside surface 707 is sloped (along the length indicated by A–B in FIG. 7b) with respect to the outside surface 703, and a groove 708 is provided around the opening 705 on the inside surface 707 to accommodate an O-ring 798.

The bottom plate 740 is also provided with an opening 745, which serves as an outlet of the valve 391. The inside surface 747 of the bottom plate 740 has a protruded portion 749, which is also sloped (along the length indicated by C–D in FIG. 7b) with respect to the outside surface 743 of the bottom plate. An O-ring groove 748 is disposed around the opening 745 on the protruded portion 749 of the inside surface 747 to accommodate an O-ring 798.

When the valve 391 is assembled, the recessed portion 709 of the top plate 700 interfits with the protruded portion 749 of the bottom plate 740, such that a space 755 is formed between the top and bottom plates 700 and 740 (see FIG. 7b). Viewed from the side (FIG. 7b), the space 755 has a tapered cross-section between A–B and C–D, and has a rectangular cross-section for the remaining portion of the space 755. The space 755 is large enough to accommodate the gate 727 and the shafts 721, 722 to slide freely between the top plate 700 and the bottom plate 740, along the direction of the arrow 777. When the valve 391 is closed by moving the gate 727 between openings 705 and 745, two O-rings 798 located inside grooves 708, 748 provide sealing for the top plate 700 and the bottom plate 740 against the gate 727. The protruded portion 708 of the top plate 700 has another groove 776 to accommodate an O-ring 774 for sealing between the top plate 700 and the bottom plate 740. The top and bottom plates 700, 740 are held together using a number of screws 797 through clearance holes 786 in the top plate 700 and threaded holes 785 in the bottom plate 740.

As shown in FIG. 7a, the gate 727 is screw-mounted onto the ends 723, 724 of two cylindrical shafts 721, 722. The other ends 725, 726 of the shafts 721, 722 fit through two holes 715, 716 located at the protruded portion 708 of the top plate 700. Two screws 795 fit through two clearance holes 765 in the handle 760, and thread into the ends 725, 726 of the shafts 721, 722. As such, the handle 760 is attached to the gate 727, and the gate 727 can be moved inside the space 755 of the valve 391 along the direction of the arrow 777. The gate 727 is wedge-shaped, tapering towards the direction of the handle 760 (see FIG. 7b). The taper of the gate 727 matches the sloped portions of the top plate 700 and the bottom plate 740 (indicated by A–B and C–D), and ensures effective sealing against O-rings 798. This wedge-shape sealing surface design is an important feature of the gate valve 391. The reduced friction between the gate 727 and O-rings 798 allows the valve 391 to be opened and closed with much less force than otherwise possible, and also reduces wear on the O-rings 798 as they seal against the gate 727.

FIG. 7b shows the assembled valve 391 coupled to two KF flanges 790 and 794 being held in place by clamps 791. An O-ring groove 706 is provided around the opening 705 on the outside surface 703 of the top plate 700. An O-ring 796 seals against the flange 790, such as a KF-type flange, which is welded to the valve body 200 of the exhaust assembly 200. Similarly, a groove 746 on the outside surface 743 of the bottom plate 740 allows an O-ring 796 to seal against the flange 794. In the present embodiment, the KF flange 790 is welded to the valve body 200 of the exhaust assembly 200, while the other KF flange 794 is welded to the cold trap housing 360, and constitutes the inlet 351 of the cold trap 300. A similar arrangement is used to couple another valve 392 between the valve body 205 and the outlet of the cold trap 300. Each of these KF flanges 790, 794 is secured to the valve 391 by two flange clamps 791. FIG. 7a illustrates two flange clamps 791 attached to the outside surface 703 of the top plate 700 by wing-nut fasteners 792 and threaded studs 704. The flange clamps 791 secure a KF flange 790 in place when the screws 793 are tightened, through clearance holes 788, into corresponding threaded holes 787 on the outside surface 703 of the top plate 700. With screws 793 removed and fasteners 792 loosened, the clamps 791 can swing free of the KF flange 790, allowing the valves 391, 392 and the cold trap 300 to be decoupled from the exhaust assembly 200 as a self-contained sealed unit.

The valve 391 in this embodiment is made of nickel-plated aluminum to provide resistance to chlorine, which is used in a chamber cleaning process, and all O-rings are made of viton. Of course, other materials can also be used (e.g., stainless steel for the valve), as long as they are compatible with the chemicals and temperature used for the specific process applications.

In the open position shown in FIG. 7b, the gate 727 is situated towards the rounded end 702 of the valve 391 and does not obstruct the openings 705, 745, thereby allowing gases to pass through the valve 391. The shafts 721 and 722 are enclosed between the top plate 700 and the bottom plate 740. When the valve 391 is closed by pulling the handle 760 out, the shafts 721, 722 protrude through the openings 715, 716 of the top plate 700, and the valve 391 can be secured in its closed position by inserting a pin (not shown) through the holes 775 (one of which is shown in FIG. 7b) of the shafts 721, 722. With both valves 391 and 392 closed, the cold trap 300 can be isolated and decoupled from the KF flanges 790 which remain attached to the valve body 205 of the exhaust assembly 200, and safely removed for cleaning.

Cold Trap Operation

During operation, exhaust gases enter the entry compartment 301 of the cold trap 300 via the inlet 351. Some molecules are adsorbed when they collide with the front surface 361F of the vertical baffle plate 361. Gases are then pumped through apertures 361a, 361b, 361c of the first vertical baffle plate 361 into the adjacent compartment 302. Due to the offset aperture design of the first and second vertical baffle plates 361, 362, most of the gas molecules entering the adjacent compartment 302 collide with the front surface 362F of the second vertical baffle plate 362, leading to additional adsorption of condensable molecules. As exhaust gases are pumped from one compartment to the next, further adsorption occurs upon molecular collisions with cold surfaces of the baffle plates. This multi-stage collision process significantly enhances the adsorption efficiency of the cold trap 300 compared to the commercially-available single-stage design. Finally, particles in the exhaust gas stream are trapped by the particle filter 380 in the compartment 310 prior to exiting the cold trap 300. The unique design of the second embodiment of the present invention offers some inherent advantages. For example, due to the compact design, only a small volume is exposed to the atmosphere during routine cleaning and maintenance, and considerable savings in pump-down time can be realized. Since the cold trap 300 is kept under vacuum during removal for cleaning, the hazardous gases or condensates are prevented from leaking out into the environment, thus ensuring the safety of operating personnel.

Although two embodiments of the heated exhaust assembly 100, 200 have been described with respect to their use in conjunction with a $TiCl_4/NH_3$-based TiN deposition chamber, it should be emphasized that they are generally adaptable to a variety of process chambers. In fact, any process which generates exhaust gases which either form deposits or contain condensables may benefit from the use of this invention. Through proper temperature control, one can confine the majority of deposits or condensables to the cold trap 150, 300, and minimize such deposits on other parts of the exhaust assembly 100, 200. This is especially valuable for processes in semiconductor fabrication, such as etching, deposition or implant, where highly corrosive or toxic gases are often present. Not only does the use of a temperature-controlled exhaust assembly prolong the life of vacuum system components, but it also greatly facilitates routine maintenance and provide a safe operating environment.

Although various embodiments which incorporate the teachings of the present invention have been shown and described in detail herein, those skilled in the art can readily devise many other varied embodiments that still incorporate these teachings.

What is claimed is:

1. A cold trap apparatus comprising:
   a multi-stage structure wherein each stage of the multi-stage structure includes a plurality of interconnecting chambers;
   a cooling coil abutting at least one wall of a chamber in each stage of the multi-stage structure; and
   a particle filter disposed in one of said plurality of interconnecting chambers, wherein exhaust gases pass through the particle filter prior to exiting the cold trap.

2. The apparatus of claim 1 wherein each of said plurality of interconnecting chambers is defined by a plurality of surfaces wherein a first surface has at least a first aperture defined therein and a second surface has at least a second aperture defined therein.

3. The apparatus of claim 2 wherein each of said plurality of surfaces are disposed in vertical and horizontal directions.

4. The apparatus of claim 2 wherein said plurality of interconnection chambers is further defined by a third surface disposed at an angle q with respect to said first surface.

5. A cold trap apparatus comprising:
   a housing having an inlet opening and an outlet opening;
   a multi-stage adsorbing structure disposed inside said housing between said inlet and said outlet opening, wherein each stage of the multi-stage adsorbing structure includes a plurality of compartments;
   a cooling coil abutting at least one wall of a compartment in each stage of the multi-stage adsorbing structure; and
   a particle filter disposed in said multi-stage adsorbing structure, wherein exhaust gases pass through the particle filter prior to exiting through said outlet opening.

6. The apparatus of claim 5, wherein said multi-stage adsorbing structure comprises:
   a plurality of baffle plates disposed inside said housing so as to form said plurality of compartments; and
   each of said plurality of compartments is defined by a plurality of surfaces wherein a first surface has at least a first aperture defined therein and a second surface has a second aperture defined therein.

7. The apparatus of claim 6, wherein each aperture of said surfaces defining one of said compartments is disposed to be offset from each of said apertures of other surfaces defining said one compartment.

8. A cold trap apparatus, comprising:
   a multi-stage trap assembly including a housing having a first opening and a second opening, a multi-stage cold trap and a particle trap;
   said multi-stage cold trap further comprising a plurality of baffle plates cooled to a predetermined temperature, wherein said plurality of baffle plates are cooled by a cooling coil in physical contact with said baffle plates, and wherein said plurality of baffle plates define a plurality of compartments inside each stage of the multi-stage cold trap; wherein said first housing opening provides an entrance to a first compartment;

said second housing opening provides an exit out of a second compartment; and each one of said remaining compartments is connected to at least two adjacent compartments by apertures defined in two baffle plates.

9. The apparatus of claim 8, wherein said plurality of baffle plates are maintained at said predetermined temperature by flowing a heat transfer medium through said cooling coil.

10. The apparatus of claim 8, wherein each of said apertures of baffle plates defining adjacent compartments is disposed to be offset from each other.

11. The apparatus of claim 9 wherein said heat transfer medium is water.

12. The apparatus of claim 8 wherein said predetermined temperature is 20–25° C.

* * * * *